US011830820B2

(12) United States Patent
Su et al.

(10) Patent No.: US 11,830,820 B2
(45) Date of Patent: *Nov. 28, 2023

(54) ELECTRONIC PACKAGE WITH ROTATED SEMICONDUCTOR DIE

(71) Applicant: MEDIATEK INC., Hsin-Chu (TW)

(72) Inventors: Yao-Chun Su, Hsinchu (TW); Chih-Jung Hsu, Hsinchu (TW); Yi-Jou Lin, Hsinchu (TW); I-Hsuan Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 41 days.

This patent is subject to a terminal disclaimer.

(21) Appl. No.: 17/553,760

(22) Filed: Dec. 16, 2021

(65) Prior Publication Data

US 2022/0108954 A1 Apr. 7, 2022

Related U.S. Application Data

(63) Continuation of application No. 16/846,381, filed on Apr. 12, 2020, now Pat. No. 11,222,850.

(Continued)

(51) Int. Cl.
*H01L 23/538* (2006.01)
*H01L 23/31* (2006.01)
(Continued)

(52) U.S. Cl.
CPC ...... *H01L 23/5386* (2013.01); *H01L 23/3128* (2013.01); *H01L 23/3675* (2013.01); *H01L 23/5385* (2013.01); *H01L 23/562* (2013.01); *H01L 23/585* (2013.01); *H01L 23/66* (2013.01); *H01L 25/0655* (2013.01); *H01L 2223/6638* (2013.01); *H01L 2223/6666* (2013.01)

(58) Field of Classification Search
CPC ............. H01L 23/5386; H01L 23/3128; H01L 23/3675; H01L 23/5385; H01L 23/562; H01L 23/585; H01L 25/0655; H01L 25/16; H01L 2223/6666; H01L 2223/6638
See application file for complete search history.

(56) References Cited

U.S. PATENT DOCUMENTS 4,705,917 A 11/1987 Gates, Jr.
7,167,936 B2 * 1/2007 Lindt ..................... H05K 1/181
333/236

(Continued)

FOREIGN PATENT DOCUMENTS

CN 108028225 A 5/2018
CN 108807283 A 11/2018
(Continued)

*Primary Examiner* — Dao H Nguyen
(74) *Attorney, Agent, or Firm* — Winston Hsu

(57) ABSTRACT

An electronic package includes a package substrate of a rectangular shape, and a chip package including a first interface circuit die and a second interface circuit die. The first interface circuit die and second interface circuit die are mounted on a redistribution layer structure and encapsulated within a molding compound. The chip package is mounted on a top surface of the package substrate and rotated relative to the package substrate above a vertical axis that is orthogonal to the top surface through a rotation offset angle. A metal ring is mounted on the top surface of the package substrate.

14 Claims, 8 Drawing Sheets

Related U.S. Application Data

(60) Provisional application No. 62/848,064, filed on May 15, 2019.

(51) Int. Cl.
*H01L 23/367* (2006.01)
*H01L 23/00* (2006.01)
*H01L 23/58* (2006.01)
*H01L 23/66* (2006.01)
*H01L 25/065* (2023.01)

(56) References Cited

U.S. PATENT DOCUMENTS

| | | | |
|---|---|---|---|
| 7,875,971 B2* | 1/2011 | Sato | H01L 23/3675 257/730 |
| 8,110,929 B2 | 2/2012 | Imaoka | |
| 10,325,841 B2* | 6/2019 | Nakagawa | H01L 24/06 |
| 10,707,196 B2* | 7/2020 | Kim | H01L 25/18 |
| 11,222,850 B2* | 1/2022 | Su | H01L 23/66 |
| 2002/0145197 A1 | 10/2002 | Ohta | |
| 2003/0147222 A1 | 8/2003 | Lindt | |
| 2004/0104475 A1* | 6/2004 | Wang | H05K 1/181 257/737 |
| 2008/0179735 A1 | 7/2008 | Urakawa | |
| 2008/0211088 A1 | 9/2008 | Sato | |
| 2009/0001574 A1 | 1/2009 | Fang | |
| 2010/0155927 A1 | 6/2010 | Cheah | |
| 2012/0127774 A1 | 5/2012 | Yoshida | |
| 2014/0048951 A1 | 2/2014 | Lin | |
| 2016/0035703 A1 | 2/2016 | Sun | |
| 2018/0261554 A1 | 9/2018 | Huang | |
| 2019/0355697 A1* | 11/2019 | Lin | H01L 24/09 |

FOREIGN PATENT DOCUMENTS

| | | |
|---|---|---|
| DE | 10 2013 103 138 A1 | 10/2013 |
| EP | 3 582 260 A2 | 12/2019 |
| EP | 3 582 260 A3 | 1/2020 |
| TW | 201618238 A | 5/2016 |
| TW | 201839931 A | 11/2018 |
| WO | 2017/049269 A1 | 3/2017 |

* cited by examiner

ELECTRONIC PACKAGE WITH ROTATED SEMICONDUCTOR DIE

CROSS REFERENCE TO RELATED APPLICATION

This application is a continuation of U.S. application Ser. No. 16/846,381 filed Apr. 12, 2020, which claims benefits from U.S. provisional application No. 62/848,064 filed May 15, 2019, which are included in their entireties herein by reference.

BACKGROUND

The present disclosure relates generally to the field of semiconductor packaging. More particularly, the present disclosure relates to an electronic package with a rotated semiconductor die.

Typically, a data communication network includes multiple communication devices and a connection infrastructure or medium for interconnecting or networking the communication devices. The communication devices may include embedded controllers. The communication devices may connect with high-speed analog serial data interfaces or ports configured to operate at Gigabit-per-second (Gbps) data rates (e.g., 56 Gbps or 112 Gbps). The serial data interfaces are configured in accordance with known data transmission standards. The connection infrastructure is capable of interfacing with such high-speed analog serial data interfaces.

The use of high-speed serial communication links in electronic systems has continued to grow. As known in the art, high-speed data links transmit data from one location to another over transmission lines. These data links can include Serializer/Deserializer data links (i.e. SerDes) that receive data in a parallel format and convert the data to a serial format for high speed transmission. SerDes data links can be part of a backplane in a communications system.

However, the prior art chip packages for high-data communication applications, which contain SerDes circuits, usually suffer from so-called SerDes loss arose from signal skew or signal delay, which in turn deteriorates the electrical performance of the chip package.

Further, it is difficult to control the coplanarity and warpage of the conventional large-size chip packages. Typically, to improve the warpage for the large-size chip packages, the foot width of the metal lid or ring is increased or dummy dies are added at open areas. Conventionally, the orientation of the fan-out die attachment is 0, 90, or 270, which is limited by substrate trace design, substrate marks such as bar code, fiducial mark or the like, and ring/lid foot width design at substrate corners.

SUMMARY

It is one object of the present disclosure to provide an improved semiconductor electronic package for high-data rate communication applications, which is capable of reducing signal skew or signal delay and thus improving electrical performance of the semiconductor electronic package.

It is another object of the present disclosure to provide an improved semiconductor electronic package with metal ring and rotated semiconductor die, which is capable of improving warpage control of the package.

One aspect of the present disclosure provides an electronic package comprising a package substrate of a rectangular shape and a chip package comprising a first interface circuit die and a second interface circuit die in proximity to the first interface circuit die. The first interface circuit die and the second interface circuit die are mounted on a redistribution layer (RDL) structure and encapsulated within a molding compound. The chip package is mounted on a top surface of the package substrate and rotated relative to the package substrate above a vertical axis that is orthogonal to the top surface through a rotation offset angle. A metal ring is mounted on the top surface of the package substrate.

According to some embodiments, the rotation offset angle is between 30 and 75 degrees.

According to some embodiments, the rotation offset angle is about 45 degrees.

According to some embodiments, the top surface of the package substrate is partitioned into four quadrants by two orthogonal axes in a two-dimensional plane.

According to some embodiments, the first interface circuit die comprises a first edge directly facing a vertex of the package substrate, wherein a first row of input/output (I/O) pads is disposed along the first edge.

According to some embodiments, the first interface circuit die comprises a second edge that is perpendicular to the first edge, wherein a second row of input/output (I/O) pads is disposed along the second edge.

According to some embodiments, a first group of solder balls is arranged along two sides joined at said vertex of the package substrate, and wherein said first row of I/O pads is electrically connected to the first group of solder balls through a plurality first traces, respectively, within one of the four quadrants on the top surface of the package substrate.

According to some embodiments, a second group of solder balls is arranged along one of said two sides joined at said vertex of the package substrate, and wherein said second row of I/O pads is electrically connected to the second group of solder balls through a plurality second traces, respectively, within said one of the four quadrants on the top surface of the package substrate.

According to some embodiments, the first interface circuit die comprises a first Serializer/Deserializer (SerDes) circuit block.

According to some embodiments, the second interface circuit die comprises a second Serializer/Deserializer (SerDes) circuit block.

According to some embodiments, the electronic package further comprises a plurality of capacitors disposed within a triangular region between the metal ring and a side of the rotated chip package.

According to some embodiments, the electronic package further comprises a plurality of chips disposed within a triangular region between the metal ring and a side of the rotated chip package.

According to some embodiments, the plurality of chips is rotated or non-rotated.

According to some embodiments, the metal ring comprises an extension portion disposed within a triangular region between the metal ring and a side of the rotated chip package for warpage control.

Another aspect of the invention provides an electronic package comprising a package substrate, and a chip package comprising a first interface circuit die and a second interface circuit die in proximity to the first interface circuit die. The first interface circuit die and the second interface circuit die are mounted on a redistribution layer structure and encapsulated within a molding compound. The chip package is mounted on a top surface of the package substrate and rotated relative to the package substrate above a vertical axis that is orthogonal to the top surface through a rotation offset angle. A metal ring is mounted on the top surface of the package substrate.

According to some embodiments, the rotation offset angle is between 30 and 75 degrees.

According to some embodiments, the rotation offset angle is about 45 degrees.

Still another aspect of the invention provides an electronic package comprising a package substrate, and a chip package comprising a first interface circuit die and a second interface circuit die in proximity to the first interface circuit die. The first interface circuit die and the second interface circuit die are mounted on a redistribution layer structure and encapsulated within a molding compound. The chip package is mounted on a top surface of the package substrate and rotated relative to the package substrate above a vertical axis that is orthogonal to the top surface through a rotation offset angle. A metal ring is mounted on the top surface of the package substrate. At least one decoupling capacitor is disposed at a corner of the package substrate. The decoupling capacitor is rotated relative to the package substrate above a vertical axis that is orthogonal to the top surface through a rotation offset angle.

According to some embodiments, the rotation offset angle is between 30 and 75 degrees.

According to some embodiments, the rotation offset angle is about 45 degrees.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
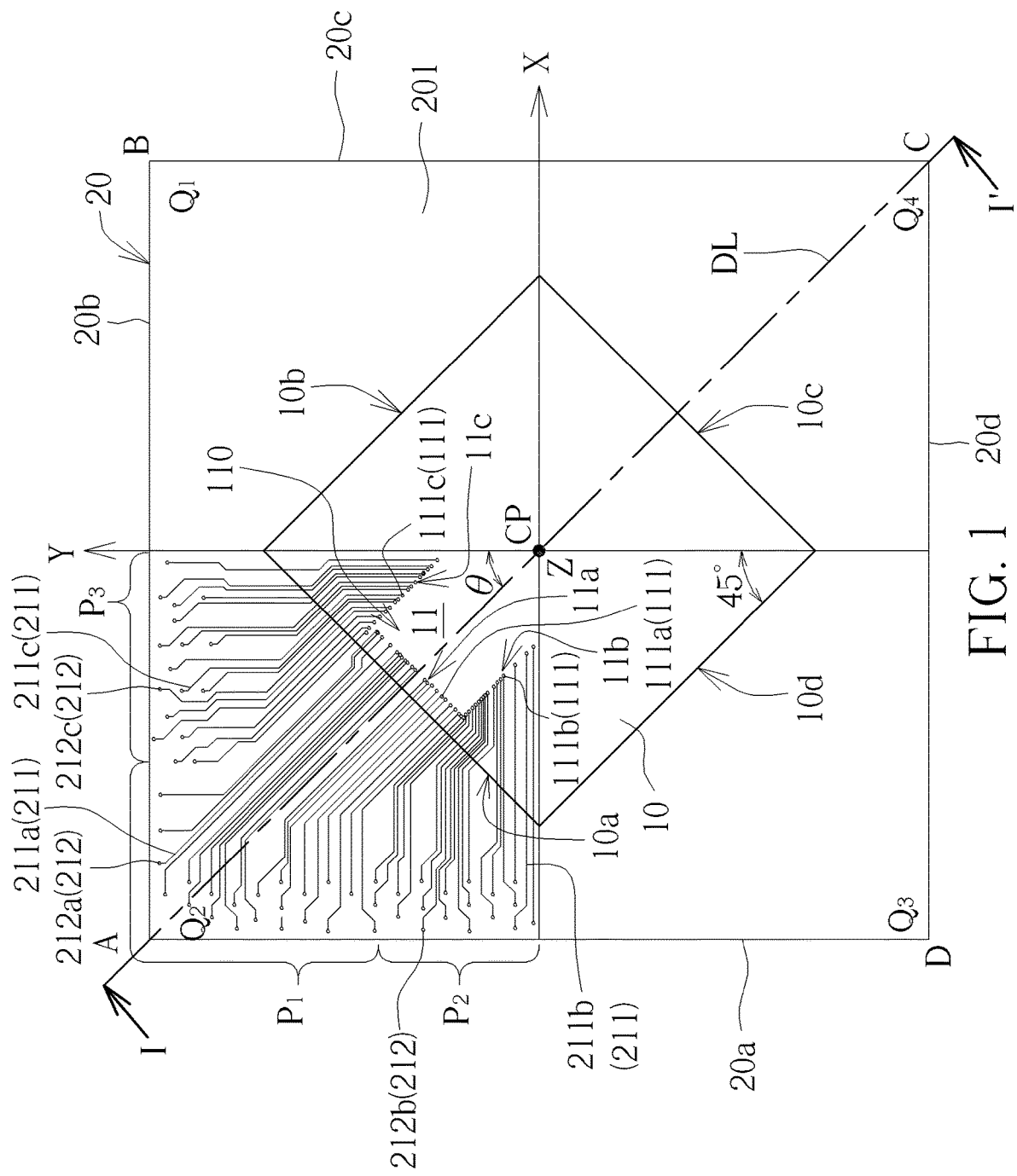
FIG. 1 is a perspective top view of a semiconductor electronic package according to one embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

A Serializer/Deserializer (SerDes) is a pair of functional blocks commonly used in high-speed communications to compensate for limited input/output. These blocks convert data between serial data and parallel interfaces in each direction. The term "SerDes" generically refers to interfaces used in various technologies and applications. The primary use of a SerDes is to provide data transmission over a single line or a differential pair in order to minimize the number of I/O pins and interconnects. SerDes data transmission implementations can be used in a wide range of communication systems and devices, such as mobile devices, desktop computers and servers, computer networks, and telecommunication networks.

The disclosed electronic package, which is configured to operate at Gigabit-per-second (Gbps) data rates, is capable of reducing signal skew and thus improving electrical performance of the chip package, which is suited for high-data rate communication applications including, but not limited to, hyper scale data centers, ultra-high performance networking switches, routers or compute applications as well as 4G and 5G service provider (backhaul) infrastructure, AI/Deep-learning applications, and novel computing applications.

Figure 2:
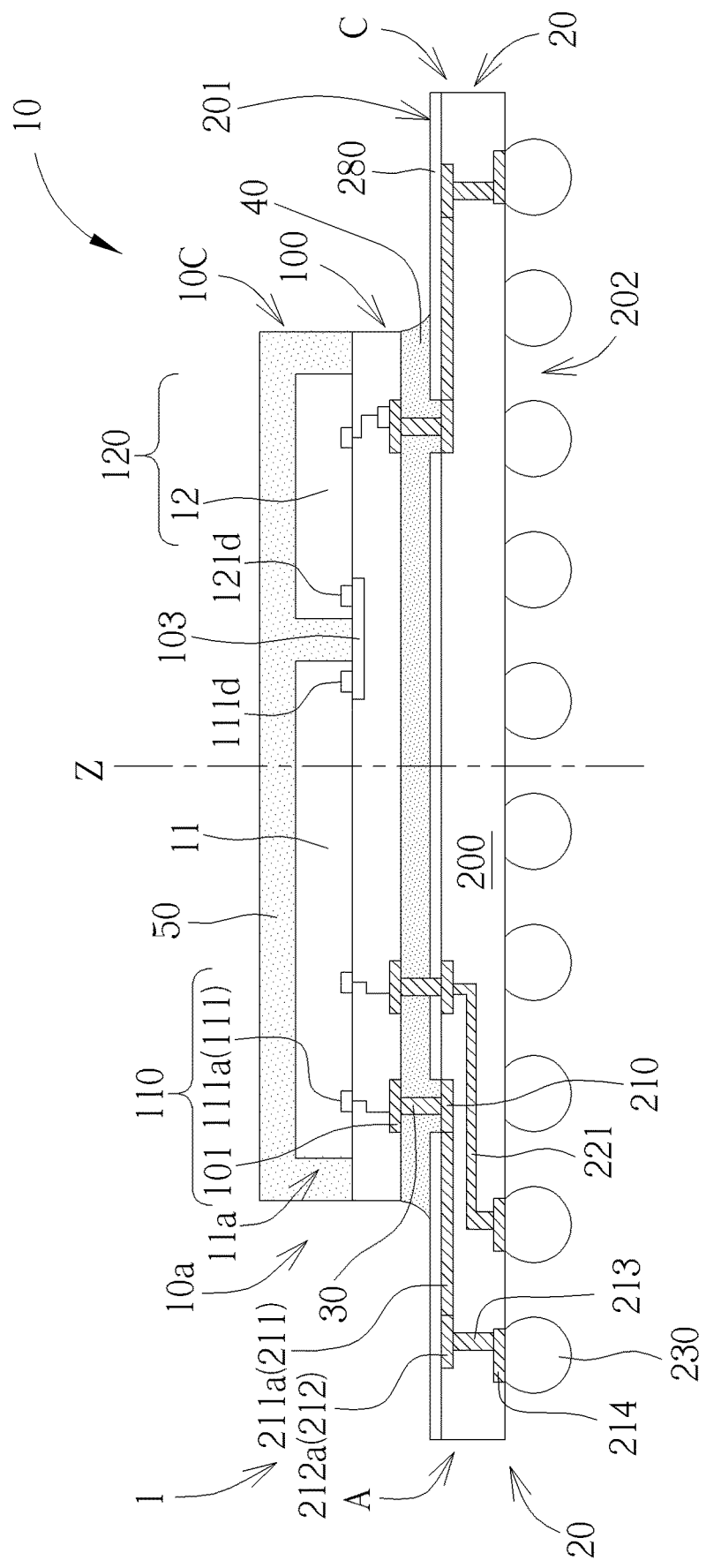
FIG. 2 is a schematic, cross-sectional diagram taken alone line I-I' in FIG. 1.
Figure 3:
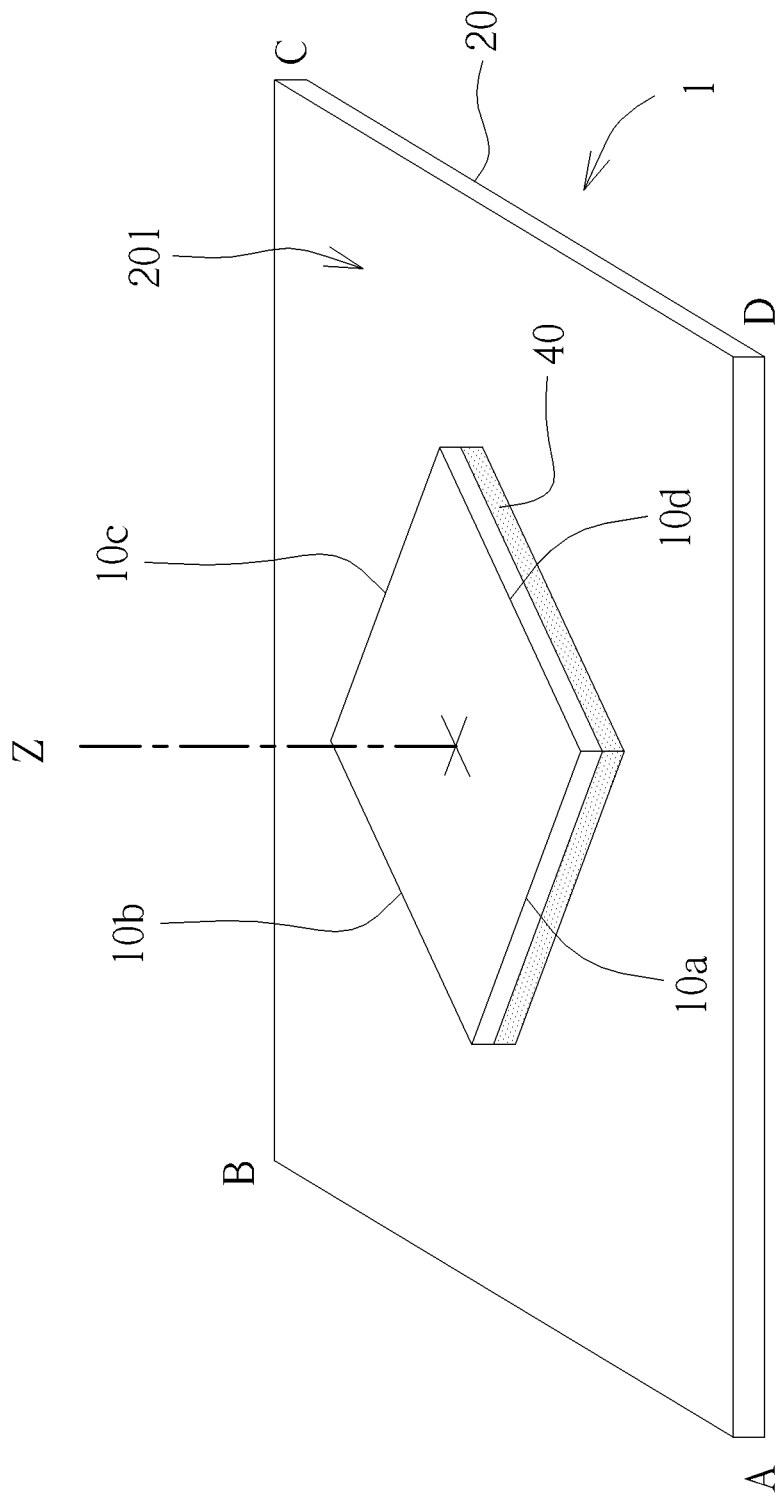
FIG. 3 is a perspective view of the semiconductor electronic package according to one embodiment of the invention.

Please refer to FIG. 1 to FIG. 3. FIG. 1 is a perspective top view of an electronic package according to one embodiment of the invention. FIG. 2 is a schematic, cross-sectional diagram taken alone line I-I' in FIG. 1. FIG. 3 is a perspective view of the electronic package according to one embodiment of the invention.

As shown in FIG. 1 to FIG. 3, in accordance with one embodiment, an electronic package 1 comprises a chip package 10 that is mounted on a top surface 201 of a package substrate 20 in a flip-chip manner and may be bonded to the top surface 201 with bumps 30. The chip package 10 and the package substrate 20 may both have a rectangular shape when viewed from the above. For example, the chip package 10 and the package substrate 20 may both have a square shape having four sides of equal length. The chip package 10 has four sides 10a~10d. The package substrate 20 has four vertices A~D and four sides 20a~20d between the four vertices A~D, respectively.

As shown in FIG. 1, the top surface 201 of the package substrate 20 may be partitioned into four 90-degree quadrants $Q_1$~$Q_4$ by two orthogonal axes (reference X and Y axes) in a two-dimensional plane (parallel to the top surface 201). The quadrants $Q_1$ and $Q_3$ are diagonally opposite each other. The quadrants $Q_2$ and $Q_4$ are diagonally opposite each other Through FIG. 1 to FIG. 3, a reference Z axis that is orthogonal to the top surface 201 or X-Y plane is shown.

According to one embodiment, the package substrate 20 may be an organic substrate comprising laminated organic material or a core 200, such as epoxy or the like. As shown in FIG. 2, a plurality of solder balls 230 may be disposed on a bottom surface 202 of the package substrate 20. The chip package 10 is mounted on the top surface 201 of a package substrate 20 through a plurality of solder joints or bumps 30. An underfill 40 may be dispensed to fill a gap (or standoff) between the chip package 10 and the package substrate 20.

The package substrate 20 may comprise multiple layers of traces, for example, traces 211 and 221.

In FIG. 2, the trace 211 is intended to be disposed in the topmost layer of traces of the multiple layers of traces of the package substrate 20. Typically, the traces 211 may be covered with a protection layer 280 such as a solder mask or the like, but is not limited thereto. The bump 30 is joined to and aligned with a corresponding bump pad 210 situated, for example, at one distal end of the trace 211. The trace 211 extends toward the corner at the vertex A or toward the two adjacent sides 20a and 20b around the corner.

The traces 211 for electrically connecting the corresponding bump pads 210 are generally disposed within the exemplary revealed quadrant $Q_2$. The trace 211 is electrically coupled to a connection pad 212. A plated through hole (PTH) 213 may be provided to electrically connect the connection pad 212 to a solder ball pad 214 at the bottom surface 202 of the package substrate 20. A solder ball 230 is planted on the solder ball pad 214 for further connection with a system board or a printed circuit board (PCB).

For the sake of simplicity, only the traces and ball arrangement within the quadrant $Q_2$ is revealed in perspective view as shown in FIG. 1. The solder balls 230 are not expressly shown in FIG. 1. However, it is understood that since the connection pads 212 is aligned with the solder ball pads 214 and therefore the solder balls 230, the position of each connection pad 212 in FIG. 1 generally represents the position of each solder ball 230. It is understood that the configuration as indicated in quadrant $Q_2$ may be employed in the other quadrants $Q_1$, $Q_3$ and $Q_4$ in other embodiments.

As shown in FIG. 1 and FIG. 3, the chip package 10 and the package substrate 20 may have the same center point CP and therefore have a concentric configuration with the chip package that is angular offset relative to the package substrate 20. According to one embodiment, for example, the chip package 10 is rotated relative to the package substrate 20 above the Z axis through a rotation offset angle θ of about 45 degrees, wherein the rotation offset angle θ is the included angle between the reference Y axis and the direction of the side 10b or 10d of the chip package 10. According to one embodiment, none of the four sides 10a~10d of the chip package 10 is parallel with any of the four sides 20a~20d of the package substrate 20.

It is intended to rotate the chip package 10 such that its one side 10a directly faces one corner at vertex A of the package substrate 20. The two sides 20a and 20b of the package substrate 20 are joined at the vertex A. The two sides 20a and 20b define boundaries of the 90-degree quadrant $Q_2$.

According to one embodiment, the chip package 10 comprises a first high-speed interface circuit die 11, which may be operated at high-speed data transmission rate of at least 1000 Mbps at frequency higher than 500 MHz. As shown in FIG. 2, the first high-speed interface circuit die 11 may be encapsulated within a molding compound 50. According to one embodiment, the first high-speed interface circuit die 11 comprises a first Serializer/Deserializer (SerDes) circuit block 110 that is located in close proximity to the side 10a that directly faces one corner at vertex A of the package substrate 20.

According to one embodiment, as shown in FIG. 1, the first high-speed interface circuit die 11 comprises a first edge 11a directly facing the corner at the vertex A of the package substrate 20, a second edge 11b that is perpendicular to the first edge 11a and is joined to the first edge 11a, and a third edge 11c that is perpendicular to the first edge 11a and is joined to the first edge 11a. According to one embodiment, the first edge 11a is in parallel with the side 10a of the chip package 10, the second edge 11b is in parallel with the side 10d of the chip package 10, and the third edge 11c is parallel with the side 10b of the chip package 10. The second edge 11b and the third edge 11c are in parallel with a diagonal line DL extending between the vertex A and the vertex C.

According to one embodiment, as shown in FIG. 1, a first row of input/output (I/O) pads 111a is disposed along the first edge 11a, a second row of I/O pads 111b is disposed along the second edge 11b, and a third row of I/O pads 111c is disposed along the third edge 11c. It is understood that these I/O pads 111 are disposed at a bottom of the first high-speed interface circuit die 11.

According to one embodiment, a redistribution layer (RDL) structure 100 may be provided between the first high-speed interface circuit die 11 and the top surface 201 of the package substrate 20 to fan-out the I/O pads 111. The RDL structure 100, which is known in the art, may be composed of dielectric layers and interconnect structures in the dielectric layers for electrically connecting the I/O pads of the high-speed interface circuit die 11 to the corresponding bump pads 101 on which the bump 30 is formed. According to one embodiment, the chip package 10 may be a fan-out wafer level package (FOWLP).

According to one embodiment, the first SerDes circuit block 110 of the first high-speed interface circuit die 11, the edges 11a~11c, the rows of I/O pads 111a~111c are generally disposed within the exemplary quadrant $Q_2$. It is understood that the chip package 10 is flipped with its active surface mounted on the top surface 201 of the package substrate 20 in a flip-chip manner.

As shown in FIG. 1, according to one embodiment, a first group of solder balls $P_1$ (solder balls are not explicitly shown in FIG. 1, but aligned with the connection pads 212a) is arranged along two sides 20a and 20b joined at the vertex A of the package substrate 20. The first row of I/O pads 111a disposed at the first edge 11a of the high-speed interface circuit die 11 is electrically connected to the first group of solder balls $P_1$ through the traces 211a, respectively, within the quadrant $Q_2$ on the top surface 201 of the package substrate 20.

According to one embodiment, a second group of solder balls $P_2$ (solder balls are not explicitly shown in FIG. 1, but aligned with the connection pads 212b) is arranged along the side 20a adjacent to the corner at the vertex A. The second row of I/O pads 111b is electrically connected to the second group of solder balls $P_2$ through traces 211b, respectively, within the quadrant $Q_2$ on the top surface 201 of the package substrate 20.

According to one embodiment, a third group of solder balls $P_3$ (solder balls are not explicitly shown in FIG. 1, but aligned with the connection pads 212c) is arranged along the side 20b adjacent to the corner at the vertex A. The third row of I/O pads 111c is electrically connected to the third group of solder balls $P_3$ through traces 211c, respectively, within the quadrant $Q_2$ on the top surface 201 of the package substrate 20.

According to one embodiment, as shown in FIG. 2, the chip package 10 may further comprises a second high-speed interface circuit die 12 in proximity to the first high-speed interface circuit die 11. The second high-speed interface circuit die 12 may comprise a SerDes circuit block 120 and may have similar trace and ball arrangement in the quadrant $Q_4$ of the top surface 201 of the package substrate 20. The first high-speed interface circuit die 11 may be electrically connected to the second high-speed interface circuit die 12 through the RDL structure 100. For example, the I/O pad 111d of the first high-speed interface circuit die 11 is electrically connected to the I/O pad 121d of the second high-speed interface circuit die 12 through the interconnect line 103 in the RDL structure 100.

It is advantageous to use the present disclosure because by providing the rotated chip package configuration, the corresponding traces and ball arrangement on the package substrate are concentrated within one of the four quadrants $Q_1$~$Q_4$, resulting in a 14.3% reduction of the maximum signal length (e.g., from about 35 mm to about 30 mm for 60×60 mm~90×90 mm package substrate), and a significant reduction of trace length difference (max. length minus min. length) from 20 mm to 13 mm. Therefore, the skew is mitigated and the signal delay as well as the electrical performance of SerDes circuit of the electronic package can be significantly improved (e.g., with improvement by 18% or about −0.5 dB).

It is noteworthy that although a rotation offset angle θ of approximately 45 degrees is used in the illustrative embodiment(s), the rotated die design in the electronic package 1 is not limited to this angle in other embodiments. For example, the rotation offset angle θ may range between 30 and 75 degrees in some embodiments.

Figure 4:
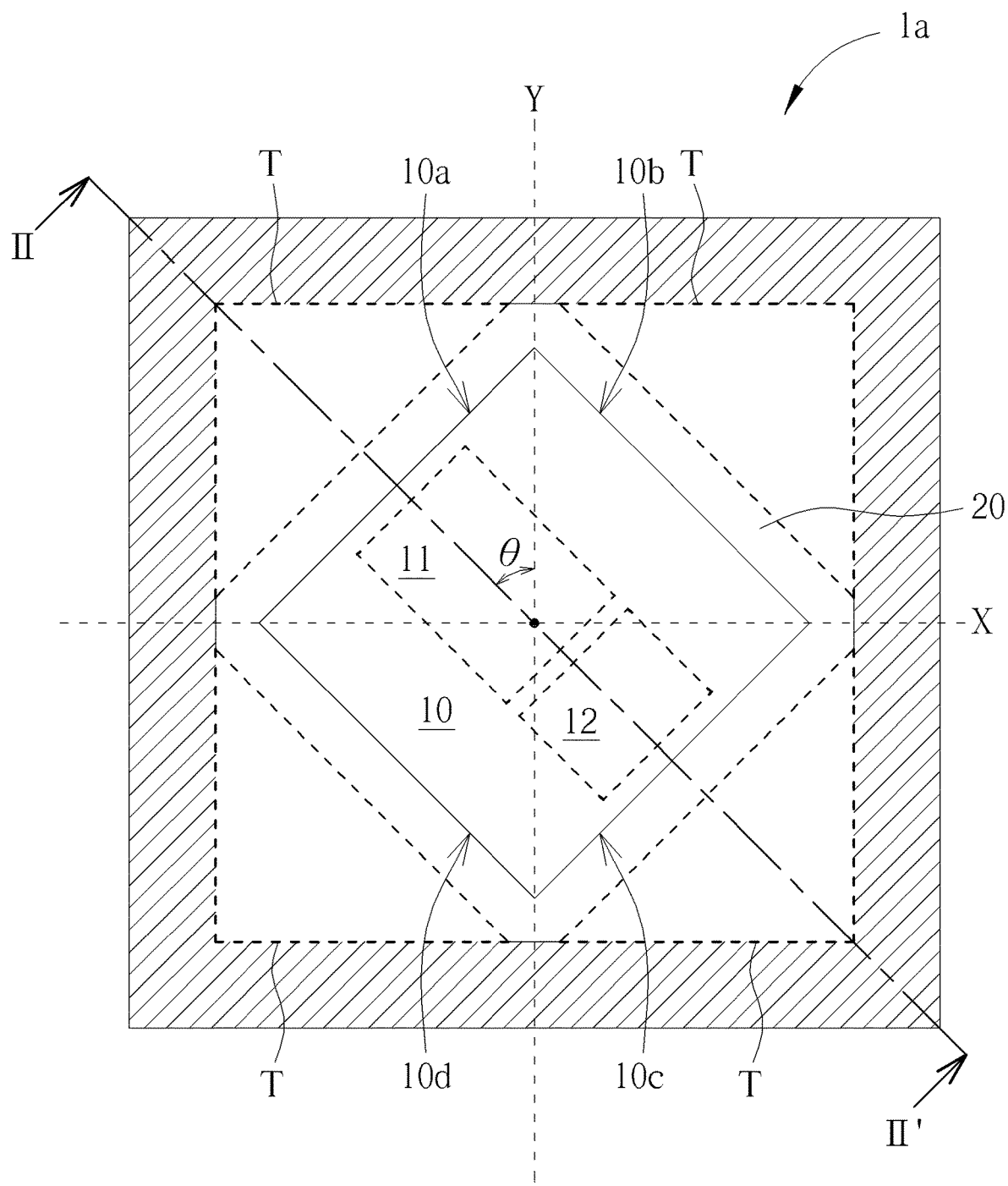
FIG. 4 is a schematic top view of an electronic package with metal ring and rotated semiconductor die on the package substrate.
Figure 5:
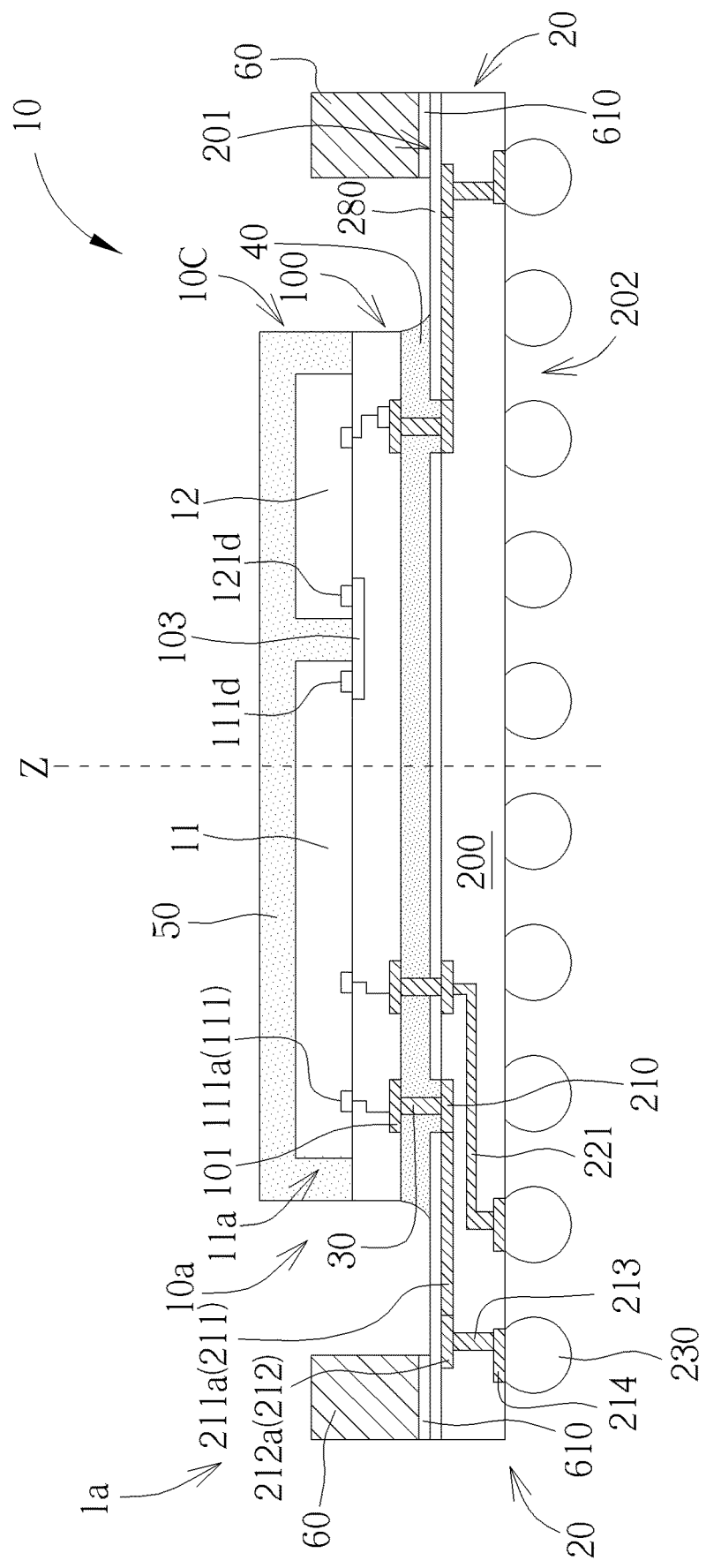
FIG. 5 is schematic, cross-sectional view taken alone line II-II' in FIG. 4.

FIG. 4 and FIG. 5 show an electronic package with metal ring and rotated semiconductor die on the package substrate, wherein like layers, elements, or regions are designated by like numeral numbers and labels. As shown in FIG. 4 and FIG. 5, the electronic package 1a according to one embodiment may comprise a metal ring (or metal frame) 60 that is adhered to the top surface 201 of the package substrate 20 with an adhesive layer 610. According to some embodiments, the metal ring 60 may be a copper ring, but is not limited thereto. According to some embodiments, the package substrate 20 has a rectangular shape and has four corners.

As previously described, the chip package 10 comprises a first high-speed interface circuit die 11 mounted on the top surface 201 of the package substrate 20, and a second high-speed interface circuit die 12 disposed in proximity to the first high-speed interface circuit die 11. The chip package 10, the first high-speed interface circuit die 11, and the second high-speed interface circuit die 12 are rotated relative to the package substrate 20 above a vertical axis (Z axis in FIG. 5) that is orthogonal to the top surface 201 through a rotation offset angle θ.

As indicated by dotted line in FIG. 4, the rotated chip package 10 on the package substrate 20 can provide some space in the triangular regions T at each of the four corners of the electronic package 1a for the improvements on warpage control or electrical performance.

Figure 6:
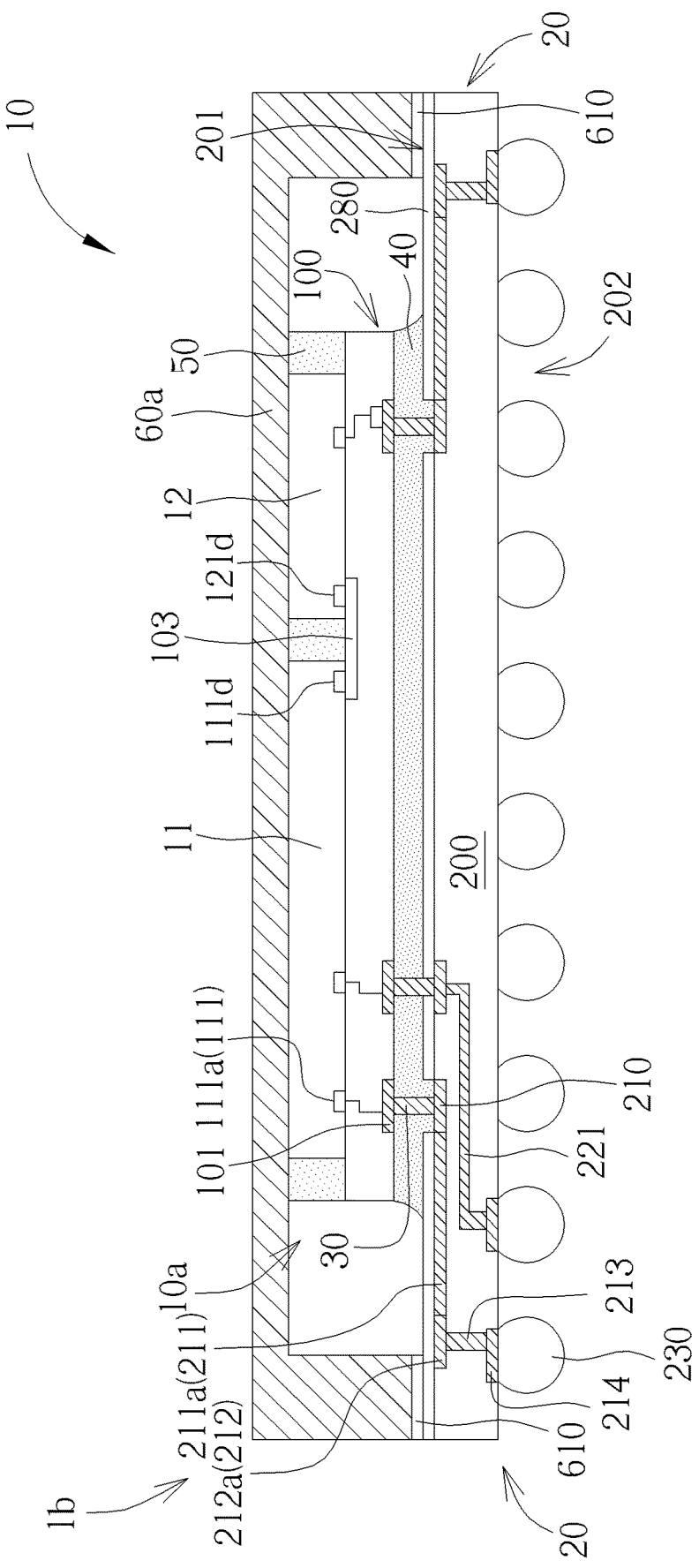
FIG. 6 is schematic, cross-sectional diagram showing an electronic package with metal lid according to another embodiment of the invention.

It is to be understood that the metal ring 60 may be replaced with a metal lid 60a that covers the top surface of the chip package 10 in some embodiments, as shown in FIG. 6. In FIG. 6, the molding compound 50 of the electronic package 1b may be polished until the top surfaces of the first high-speed interface circuit die 11 and the second high-speed interface circuit die 12 are exposed. The metal lid 60a may be in thermal contact with the exposed top surfaces of the first high-speed interface circuit die 11 and the second high-speed interface circuit die 12.

Figure 7:
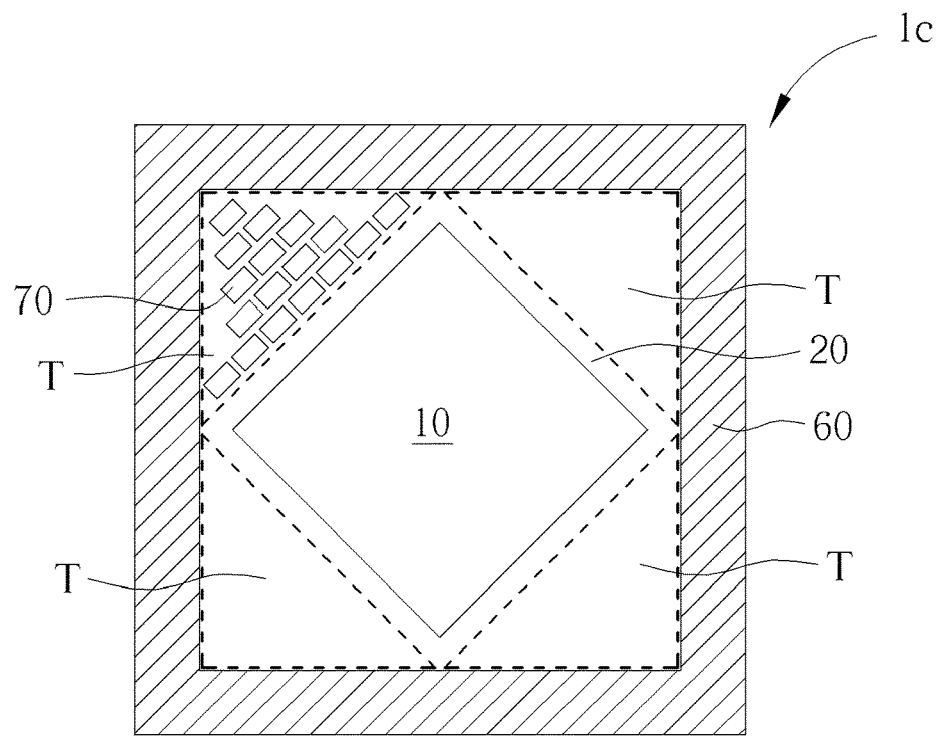
FIG. 7 is a schematic top view of an electronic package with metal ring and rotated semiconductor die showing that more decoupling capacitors are disposed within the triangular regions between the metal ring and the chip package according to another embodiment of the invention.

According to some embodiments, as shown in FIG. 7, the triangular regions T between the metal ring 60 and the chip package 10 may be used to accommodate more decoupling capacitors 70 in the triangular regions T at each of the four corners. Therefore, the electronic package 1c comprises more decoupling capacitors at the corners of the package, thereby improving the electrical performance such as the performance of the power distribution network (PDN).

According to some embodiments, at least one decoupling capacitor 70 may be disposed at the corner of the package substrate 1c wherein the decoupling capacitor 70 is rotated relative to the package substrate 20 above a vertical axis (Z axis in FIG. 5) that is orthogonal to the top surface 201 through a rotation offset angle θ.

Figure 8:
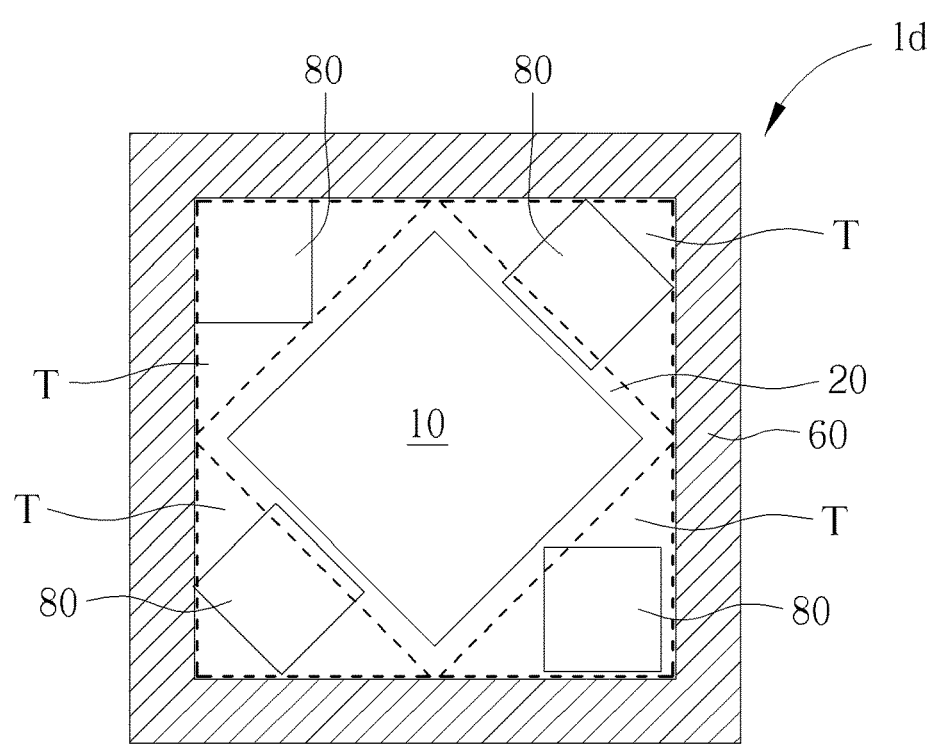
FIG. 8 is a schematic top view of an electronic package with metal ring and rotated semiconductor die showing that some chips are disposed within the triangular regions between the metal ring and the chip package according to another embodiment of the invention.

According to some embodiments, as shown in FIG. 8, the triangular regions T between the metal ring 60 and the chip package 10 may be used to accommodate more chips 80 or chips with a larger size. The chips 80 disposed within the triangular regions T may be rotated or non-rotated. By providing such configuration in the electronic package 1d, the multi-chip modules could be larger and more symmetric, resulting in better package warpage control and improved electrical performance. The modules could be molding-type (with or without function) packages to balance the coefficient of thermal expansion (CTE) mismatch and improve the package warpage.

Figure 9:
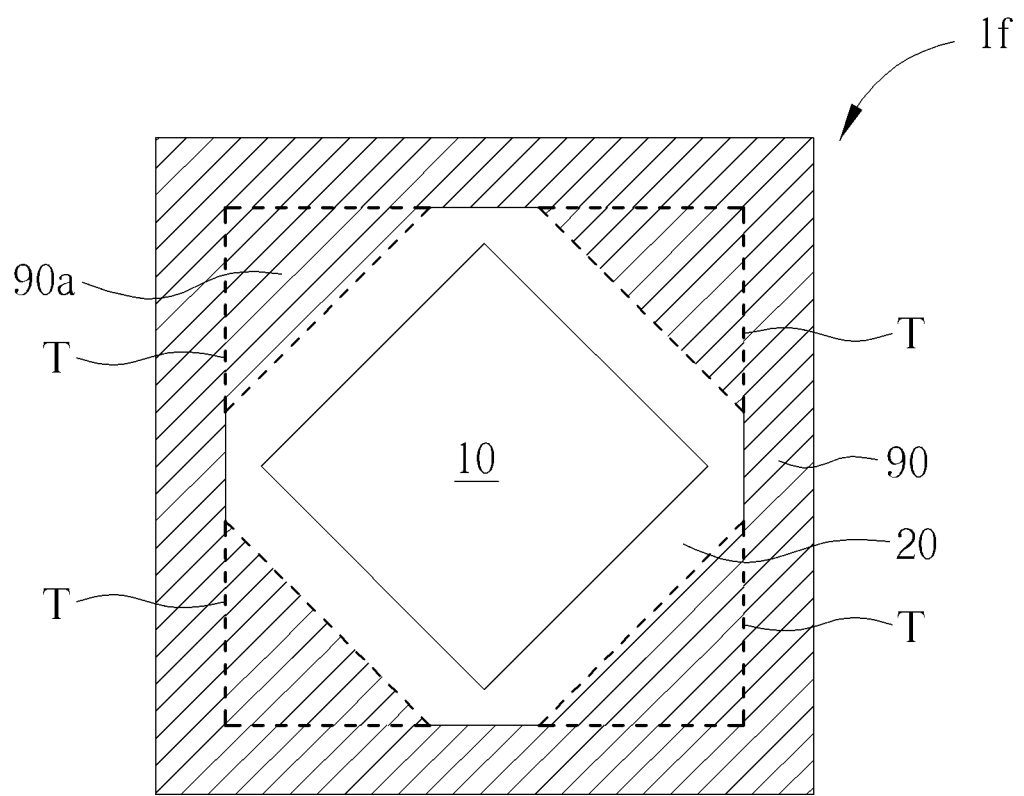
FIG. 9 is a schematic top view of an electronic package with extended metal ring for warpage control according to another embodiment of the invention.

According to some embodiments, as shown in FIG. 9, the metal ring 90 may comprise an extension portion 90a within the triangular regions T between the metal ring 60 and the chip package 10 as indicated by dotted line in FIG. 4. The package warpage control is improved because of the wider ring foot standing at the four corners of the electronic package 1f.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic package, comprising:
   a package substrate of a rectangular shape;
   a chip package comprising a first interface circuit die and a second interface circuit die in proximity to the first interface circuit die, wherein the first interface circuit die and the second interface circuit die are mounted on a redistribution layer (RDL) structure and encapsulated within a molding compound, wherein the chip package is mounted on a top surface of the package substrate and rotated relative to the package substrate above a vertical axis that is orthogonal to the top surface through a rotation offset angle;
   a metal ring mounted on the top surface of the package substrate; and
   a plurality of capacitors disposed within a triangular region between the metal ring and a side of the rotated chip package.

2. The electronic package according to claim 1, wherein the rotation offset angle is between 30 and 75 degrees.

3. The electronic package according to claim 1, wherein the rotation offset angle is about 45 degrees.

4. The electronic package according to claim 1, wherein the top surface of the package substrate is partitioned into four quadrants by two orthogonal axes in a two-dimensional plane.

5. The electronic package according to claim 4, wherein the first interface circuit die comprises a first edge directly facing a vertex of the package substrate, wherein a first row of input/output (I/O) pads is disposed along the first edge.

6. The electronic package according to claim 5, wherein the first interface circuit die comprises a second edge that is perpendicular to the first edge, wherein a second row of input/output (I/O) pads is disposed along the second edge.

7. The electronic package according to claim 6, wherein a first group of solder balls is arranged along two sides joined at said vertex of the package substrate, and wherein said first row of I/O pads is electrically connected to the first group of solder balls through a plurality first traces, respectively, within one of the four quadrants on the top surface of the package substrate.

8. The electronic package according to claim 7, wherein a second group of solder balls is arranged along one of said two sides joined at said vertex of the package substrate, and wherein said second row of I/O pads is electrically connected to the second group of solder balls through a plurality second traces, respectively, within said one of the four quadrants on the top surface of the package substrate.

9. The electronic package according to claim 1, wherein the first interface circuit die comprises a first Serializer/Deserializer (SerDes) circuit block.

10. The electronic package according to claim 1, wherein the second interface circuit die comprises a second Serializer/Deserializer (SerDes) circuit block.

11. The electronic package according to claim 1, wherein the metal ring comprises an extension portion disposed within a triangular region between the metal ring and a side of the rotated chip package for warpage control.

12. An electronic package, comprising:
    a package substrate;
    a chip package comprising a first interface circuit die and a second interface circuit die in proximity to the first interface circuit die, wherein the first interface circuit die and the second interface circuit die are mounted on a redistribution layer structure and encapsulated within a molding compound, wherein the chip package is mounted on a top surface of the package substrate and rotated relative to the package substrate above a vertical axis that is orthogonal to the top surface through a rotation offset angle;
    a metal ring mounted on the top surface of the package substrate; and
    at least one decoupling capacitor at a corner of the package substrate, wherein the decoupling capacitor is rotated relative to the package substrate above a vertical axis that is orthogonal to the top surface through a rotation offset angle.

13. The electronic package according to claim 12, wherein the rotation offset angle is between 30 and 75 degrees.

14. The electronic package according to claim 12, wherein the rotation offset angle is about 45 degrees.

* * * * *